(12) United States Patent
Yasuda et al.

(10) Patent No.: US 8,796,657 B2  
(45) Date of Patent: **\*Aug. 5, 2014**

(54) MEMORY ELEMENT AND MEMORY DEVICE

(75) Inventors: Shuichiro Yasuda, Kanagawa (JP); Tetsuya Mizuguchi, Kanagawa (JP); Masayuki Shimuta, Kanagawa (JP); Katsuhisa Aratani, Kanagawa (JP); Kazuhiro Ohba, Miyagi (JP)

(73) Assignee: Sony Corporation, Tokyo (JP)

( * ) Notice: Subject to any disclaimer, the term of this patent is extended or adjusted under 35 U.S.C. 154(b) by 142 days.

This patent is subject to a terminal disclaimer.

(21) Appl. No.: 13/370,428

(22) Filed: Feb. 10, 2012

(65) Prior Publication Data

US 2012/0218808 A1 Aug. 30, 2012

(30) Foreign Application Priority Data

Feb. 28, 2011 (JP) .................................. 2011-042174

(51) Int. Cl.
*H01L 29/02* (2006.01)

(52) U.S. Cl.
USPC ............................................................ 257/2

(58) Field of Classification Search
CPC .............................. H01L 45/141; H01L 45/14

USPC ................... 257/3, 4, 5, E47.001, E21/622, 2
See application file for complete search history.

(56) References Cited

U.S. PATENT DOCUMENTS

2009/0173930 A1* 7/2009 Yasuda et al. ..................... 257/4
2010/0291748 A1* 11/2010 Dressler et al. ............... 438/384

FOREIGN PATENT DOCUMENTS

| JP | 2006-196537 | 7/2006 |
| JP | 2009-043757 | 2/2009 |

OTHER PUBLICATIONS

Rainer Waser et al.; Redox-Based Resistive Switching Memories—Nanoionic Mechanisms, Prospects, and Challenges; Advanced Materials; 2009; 21, 2632-2663.

\* cited by examiner

*Primary Examiner* — Yu-Hsi D Sun  
(74) *Attorney, Agent, or Firm* — Dentons US LLP

(57) ABSTRACT

There are provided a memory element and a memory device with improved repetition characteristics during operations at a low voltage and current. The memory element includes a first electrode, a memory layer, and a second electrode in this order. The memory layer includes a resistance change layer disposed on the first electrode side, and an ion source layer disposed on the second electrode side, and having a resistivity of 2.8 mΩcm or higher but lower than 1 Ωcm.

11 Claims, 8 Drawing Sheets

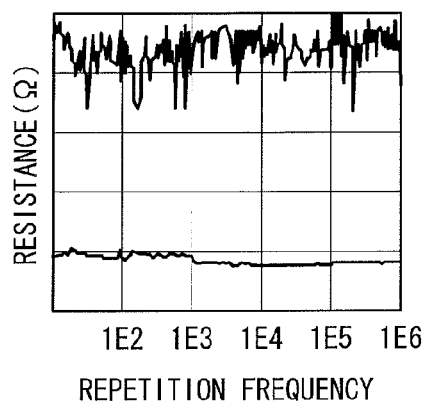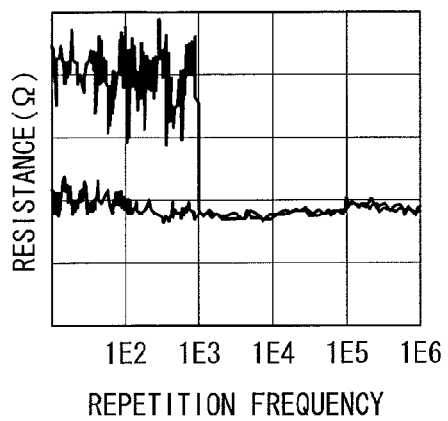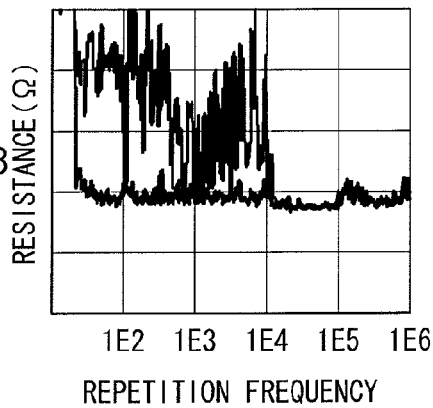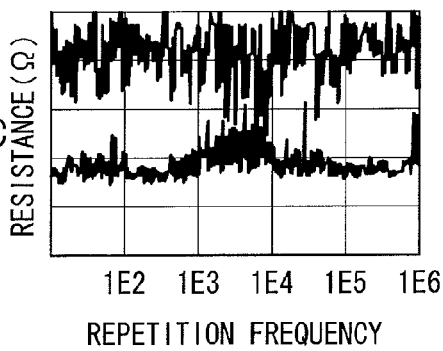

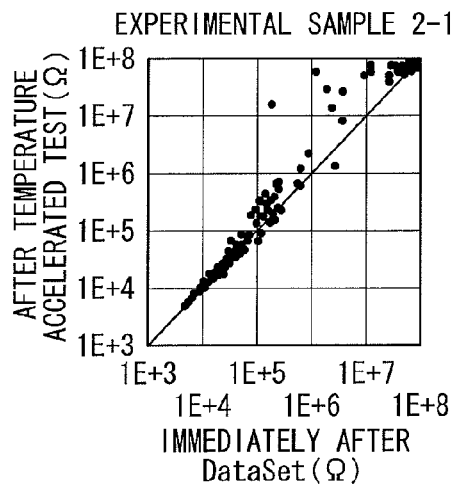
FIG. 8A — EXPERIMENTAL SAMPLE 2-1
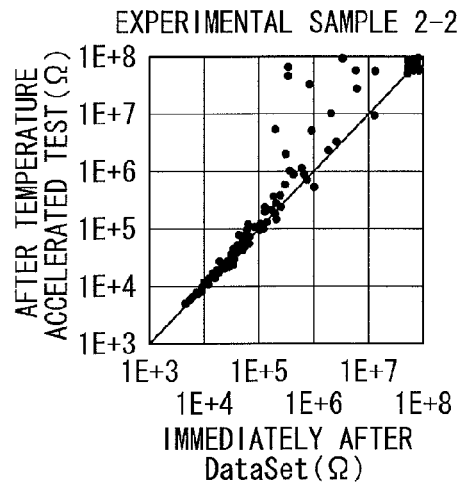
FIG. 8B — EXPERIMENTAL SAMPLE 2-2
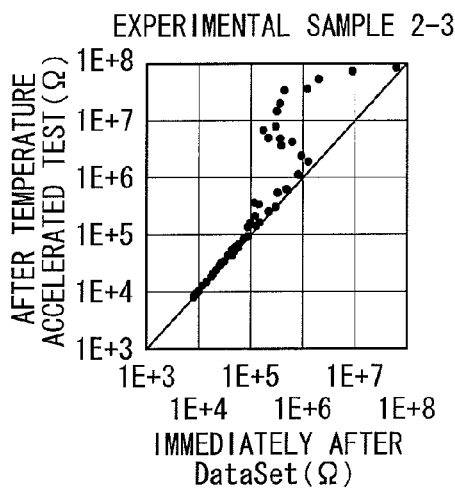
FIG. 8C — EXPERIMENTAL SAMPLE 2-3
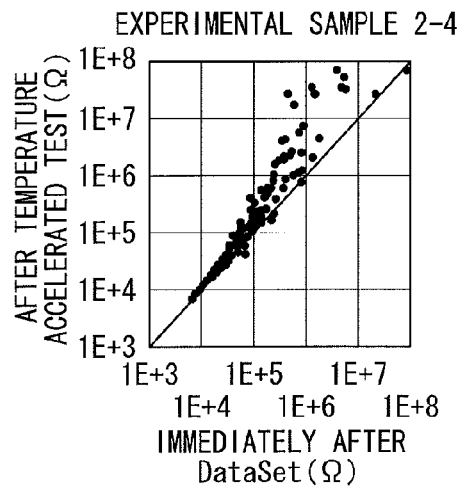
FIG. 8D — EXPERIMENTAL SAMPLE 2-4
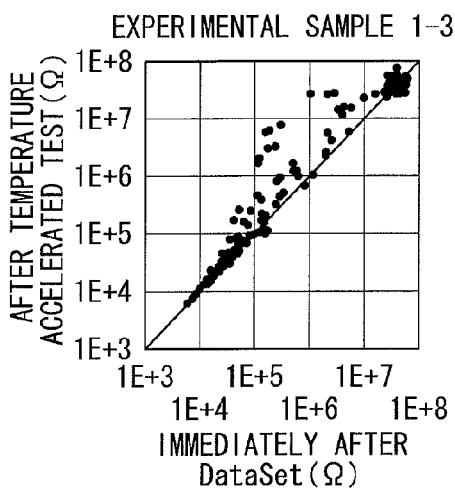
FIG. 8E — EXPERIMENTAL SAMPLE 1-3
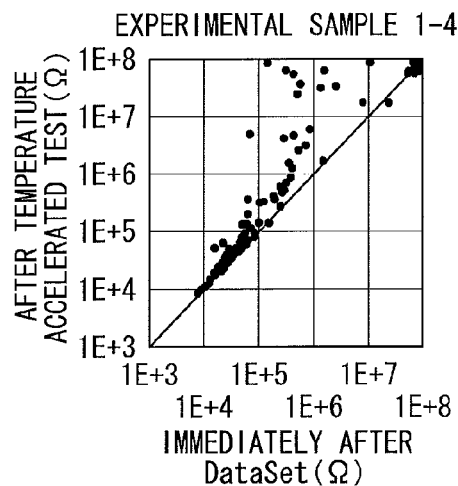
FIG. 8F — EXPERIMENTAL SAMPLE 1-4

EXPERIMENTAL SAMPLE 2-3

EXPERIMENTAL SAMPLE 2-4

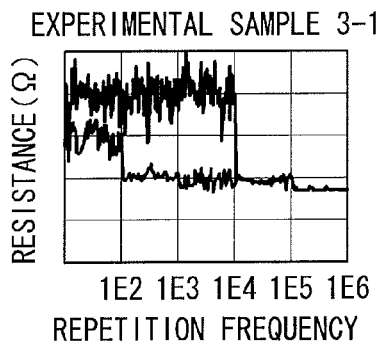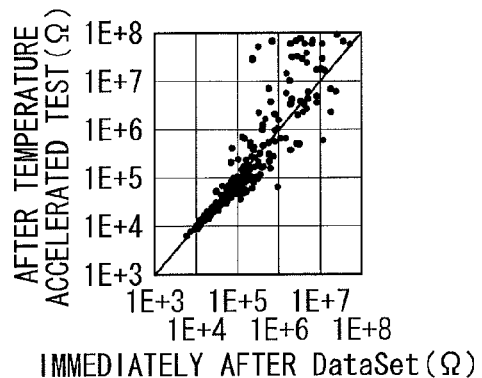
FIG. 10A
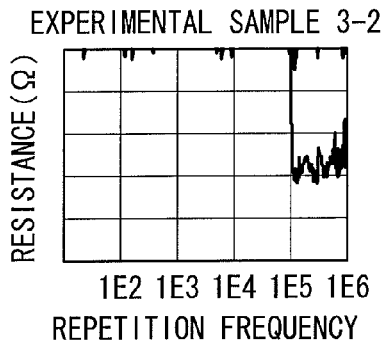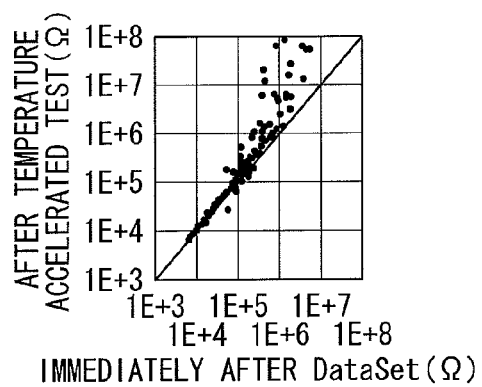
FIG. 10B
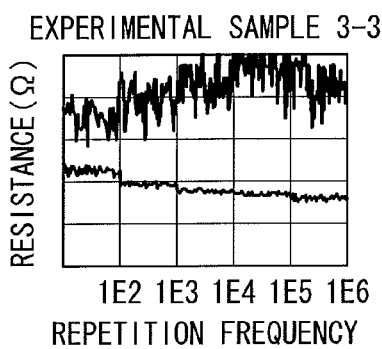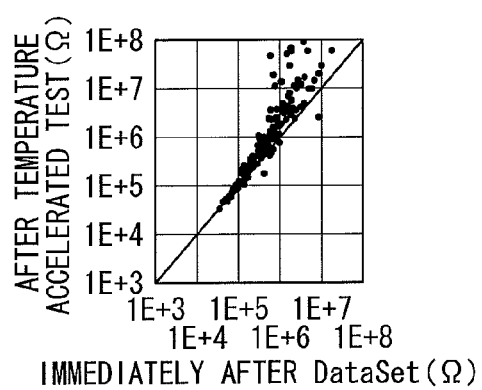
FIG. 10C
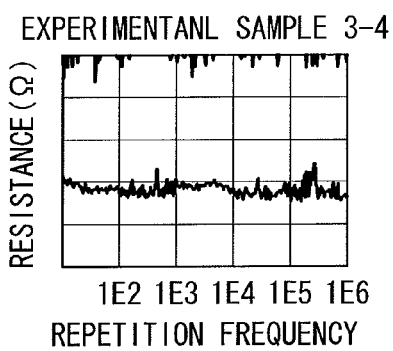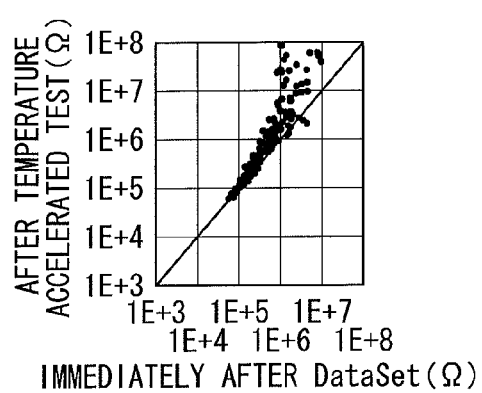
FIG. 10D

MEMORY ELEMENT AND MEMORY DEVICE

BACKGROUND

The present disclosure relates to a memory element and a memory device which store information based on any change of electrical characteristics observed in a memory layer including an ion source layer and a resistance change layer.

A semiconductor nonvolatile memory popularly used for data storage has been a NOR or NAND flash memory. Such a semiconductor nonvolatile memory, however, has been pointed out that there are limitations on microfabrication considering the need for a high level of voltage for writing and erasing, and the limited number of electrons injected into a floating gate.

For overcoming such limitations on microfabrication, a next-generation nonvolatile memory currently proposed is a resistance change memory such as ReRAM (Resistance Random Access Memory) or PRAM (Phase-Change Random Access Memory) (for example, see Japanese Unexamined Patent Application Publication No. 2006-196537, and Waser et. al., Advanced Material, 21, p 2932 (2009). These memories are each in the simple configuration including a resistance change layer between two electrodes. In the memory of Japanese Unexamined Patent Application Publication No. 2006-196537, as an alternative to the resistance change layer, an ion source layer and an oxide film (thin film for storage) are provided between first and second electrodes. These resistance change memories are each formed therein with a conductive path through migration of atoms or ions by heat or an electric field, whereby a resistance value is supposed to change. For reference, see Japanese Unexamined Patent Application Publication No. 2009-43757.

SUMMARY

For increasing the capacity of the resistance-change nonvolatile memory as such by the leading semiconductor process, expected is the reduction of voltage and current. This is because the smaller a transistor to be driven becomes, the lower the current and voltage for driving the transistor will be. In other words, in order to implement a smaller-sized resistance-change nonvolatile memory, the resulting memory is desirably driven by a transistor also small in size. In order to enable the operation at a low current, there may need to retain the state of resistance (data) being the result of rewriting with a low current at a high speed (nanosecond-order short pulses), and to restore a resistance value with low voltage or current pulses.

However, if elements of a resistance change memory previously in use are microfabricated, the resistance value of the resulting resistance change layer may not be restored enough even if the applied voltage or current pulses are low, and the repetition characteristics are to be disadvantageously reduced.

It is thus desirable to provide a memory element and a memory device with improved repetition characteristics during operations at a low voltage and current.

A memory element according to an embodiment of the present disclosure includes a first electrode, a memory layer, and a second electrode in this order. In the memory element, the memory layer includes a resistance change layer disposed on the first electrode side, and an ion source layer disposed on the second electrode side with a resistivity of 2.8 mΩcm or higher but lower than 1 Ωcm.

A memory device according to another embodiment of the present disclosure includes a plurality of memory elements each including a first electrode, a memory layer, and a second electrode in this order, and a pulse application unit applying a voltage or current pulse selectively to the memory elements. In the memory device, the memory elements are each the memory element according to the embodiment of the present disclosure.

With the memory element (memory device) according to the embodiments of the present disclosure, when voltage or current pulses of "positive direction" (e.g., the first electrode side is at a negative potential, and the second electrode side is at a positive potential) are applied with respect to the element in the initial state (high-resistance state), any metallic element contained in the ion source layer is ionized and diffused in the resistance change layer, and then is deposited by bonding with electrons at the first electrode, or remains in the resistance change layer and forms an impurity level. As a result, a low-resistance section (conductive path) containing the metallic element is formed in the memory layer, thereby decreasing the resistance of the resistance change layer (state of recording). When current pulses of "negative direction" (e.g., the first electrode side is at a positive potential, and the second electrode side is at a negative potential) are applied with respect to the element in the low-resistance state as such, the metallic element that has been deposited on the first electrode is ionized, and then is dissolved into the ion source layer. As a result, the conductive path made of the metallic element disappears, and the resistance change layer is increased in resistance (initial state or state of erasing).

Herein, with the ion source layer having the resistivity of 2.8 mΩcm or higher but lower than 1 Ωcm, the metallic element configuring the conductive path is ionized better by the application of low voltage or current pulses, thereby restoring the resistance value of the resistance change layer.

According to the memory element or the memory device in the embodiment of the present disclosure, with the ion source layer having the resistivity of 2.8 mΩcm or higher but lower than 1 Ωcm, the resistance value of the resistance change layer is restored better from the state of recording at the time of application of low voltage or current pulses to the state of erasing. In other words, the repetition characteristics are favorably improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 6A-1 to 6C are each a diagram showing the repetition characteristics of Example 1.

FIGS. 8A to 8F are each a diagram showing the characteristics of data retention of Example 2.

FIGS. 10A to 10D are each a diagram showing the repetition characteristics and the characteristics of data retention of Example 3.

DETAILED DESCRIPTION OF THE PREFERRED EMBODIMENTS

In the below, by referring to the accompanying drawings, embodiments of the present disclosure are described in the following order.
(First Embodiment)
1. Memory Element (Memory Element with Memory Layer including Ion Source Layer and Resistance Change Layer)
2. Memory Device
(Second Embodiment)
(Memory Element with Memory Layer in Three-Layer Structure of Ion Source Layer, Intermediate Layer, and Resistance Change Layer)
(Examples)

First Embodiment

Memory Element

Figure 1:
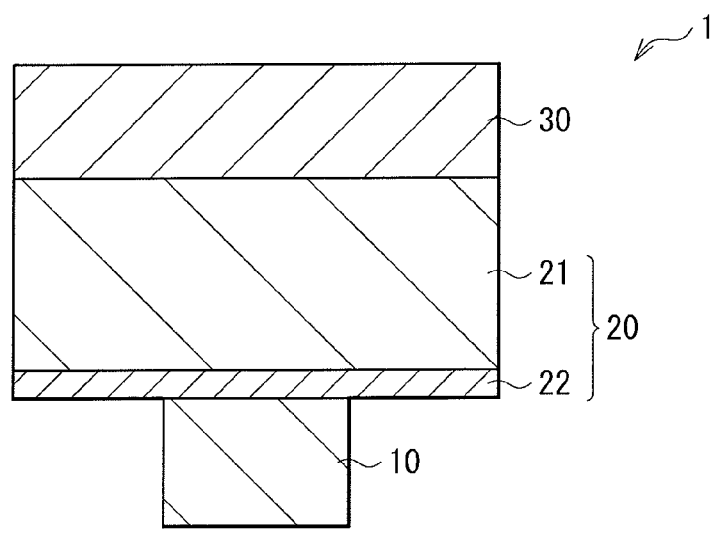
FIG. 1 is a cross-sectional view of a memory element in a first embodiment of the present disclosure, showing the configuration thereof.

FIG. 1 is a cross-sectional view of a memory element 1 in a first embodiment of the present disclosure, showing the configuration thereof. This memory element 1 is configured to include a lower electrode 10 (first electrode), a memory layer 20, and an upper electrode 30 (second electrode) in this order.

The lower electrode 10 is provided on a silicon substrate 41 formed with a CMOS (Complementary Metal Oxide Semiconductor) circuit as will be described later (FIG. 2), for example, thereby serving as a connection section with the portion of the CMOS circuit. This lower electrode 10 is made of a material for wiring use in the semiconductor process, e.g., tungsten (W), tungsten nitride (WN), copper (Cu), aluminum (Al), molybdenum (Mo), tantalum (Ta), and silicide. When the lower electrode 10 is made of a material such as Cu that possibly causes ion conduction in an electric field, the surface of the lower electrode 10 made of Cu or others as such may be covered with a material that hardly causes ion conduction or thermal diffusion, e.g., W, WN, titanium nitride (TiN), and tantalum nitride (TaN). When an ion source layer 21 that will be described later contains Al, preferably used is a metal film containing at least one of chromium (Cr), W, cobalt (Co), Si, gold (Au), palladium (Pd), Mo, iridium (Ir), titanium (Ti), and others that are more resistant to ionization than Al, or an oxide or nitride film thereof.

The memory layer 20 is configured by the ion source layer 21, and a resistance change layer 22. The ion source layer 21 contains an element to be converted into movable ions (cations and anions) that diffuse to the resistance change layer 22. The element that is possibly cationized includes one or more of metallic elements such as Cu, Al, germanium (Ge), and zinc (Zn). As an ion conductive material that is to be anionized includes at least one of chalcogen elements including oxygen (O) or tellurium (Te), sulfur (S) and selenium (Se), for example. The ion source layer 21 is disposed on the upper electrode 30 side, and in this example, is in contact with the upper electrode 30. The metallic element(s) and the chalcogen element(s) are bonded together, thereby forming a metal chalcogenide layer. This metal chalcogenide layer mainly has the amorphous structure, and serves as an ion supply source.

As for the metallic element that is possibly cationized, as is reduced on the cathode electrode during the operation of writing and forms a conductive path (filament) in the form of metal, any element chemically stable is preferable, i.e., possibly remains in the form of metal in the ion source layer 21 containing the chalcogen element(s) described above. Such a metallic element includes, in addition to those described above, transition metals of groups 3 to 11 in the periodic table, for example. Among these elements, one or more are possibly used. Alternatively, silver (Ag), Si, and others may be used as additive elements to the ion source layer 21. Among the transition metals described above, for stabilization of the conductive path (filament) and for adjustment of resistivity of the ion source layer 21 described above, two or more of the following are preferably used, i.e., zirconium (Zr), hafnium (Hf), Mo, W, niobium (Nb), Ta, platinum (Pt), Cr, manganese (Mn), and iron (Fe).

In the embodiment, the ion source layer 21 preferably has the resistivity of 2.8 mΩcm or higher but lower than 1 Ωcm. As described above, in the memory element 1, by dissolving the filament which is formed at the time of writing, the resistance value is restored in the resistance change layer 22 reduced in resistance so that erasing of data is performed. At this time, if the ion source layer 21 is low in resistivity, application of an erasing voltage may not be appropriately performed, and thus the filament may possibly not be dissolved, that is, erasing of data may not be performed. On the other hand, if the ion source layer 21 has a too high resistance value, writing of data may not be performed. In consideration thereof, the ion source layer 21 preferably has the resistivity falling in an appropriate range, i.e., in the range described above. For stable writing and erasing of data at a lower current, e.g., at a current of about 75 μA, the resistivity of the ion source layer 21 is preferably set to fall in a range from 2.8 mΩcm to 127 mΩcm both inclusive, and more preferably, in a range from 2.8 mΩcm to 44 mΩcm both inclusive. With the resistivity as such, erasing of data may be performed without fail.

Incidentally, by using any metallic element (M) that is more likely to react with Te in the resistance change layer 22 that will be described later, the resulting ion source layer 21 may be in the layered structure of Te/Ion Source Layer (containing the metallic element M). If this is the structure, with a heat treatment after the film formation, the resulting structure is stabilized as MTe/Ion Source Layer 21. The element more likely to react with Te is exemplified by Al, magnesium (Mg), and others.

Examples of the specific material of the ion source layer 21 as such include ZrTeAl, TiTeAl, CrTeAl, WTeAl, TaTeAl, and others. Such specific materials may also include CuZrTeAl being a result of addition of Cu to ZrTeAl, CuZrTeAlGe being a result of addition of Ge to CuZrTeAl, and CuZrTeAlSiGe being a result of addition of another additive element to CuZrTeAlGe. Another option is ZrTeMg including Mg as an alternative to Al. As for the ionizing metallic element, any similar additive element is possibly used even if a transition metallic element selected for use is not Zr but Mo, Mn, or Hf, e.g., possibly CuMoTeAl, and CuMnTeAl. Moreover, as for the ion conductive material, Te is surely not restrictive, and sulfur (S), selenium (Se), or iodine (I) may be also used, i.e., specifically ZrSAl, ZrSeAl, ZrIAl, CuGeTeAl, and others, and Ta, W, or others may be added.

Note that the ion source layer 21 may be added with any other elements for the purpose of preventing peeling of film during a high-temperature heat treatment for the memory layer 20, for example. Silicon (Si) is an exemplary additive element that possibly offers also the improvement of retention characteristics, and is preferably added to the ion source layer 21 together with Zr. Herein, if the content of Si for addition is not enough, the effect of preventing the film peeling is not sufficiently produced, and if the content thereof is too much, the resulting memory operation characteristics are not satisfactory enough. In consideration thereof, the content of Si in the ion source layer 21 is preferably in the range of about 10 to 45 atomic %.

The resistance change layer 22 is disposed on the lower electrode 10 side, and in this example, is in contact with the lower electrode 10. This resistance change layer 22 serves as a barrier against electric conduction, and shows a change of resistance value when a predetermined level of voltage is applied between the lower and upper electrodes 10 and 30. In this embodiment, this resistance change layer 22 is made of any substance as long as it is a semiconductor or insulator that remains stable when being in contact with the ion source layer 21. Such a substance is exemplified by oxides or nitrides containing at least one of rare-earth elements including Gd (gadolinium), main group elements including Al, Mg, Ge, and Si, and transition elements including Ta, Hf, Zr, Nb, Cr, Ti, and Cu. Moreover, the resistance change layer 22 preferably has the initial resistance value of 1 M$\Omega$ or larger, and the resistance value in the state of low resistance is preferably several hundred k$\Omega$ or smaller. For reading at a high speed the state of resistance of any microfabricated resistance change memory, the resistance value in the state of low resistance is preferably as low as possible. However, since the resistance value is 40 to 100 k$\Omega$ when writing is performed with the requirements of 20 to 50 $\mu$A and 2 V, the memory is supposed to have the initial resistance value higher than that value. Allowing for the one-digit width of resistance separation, the resistance value described above is considered appropriate. Note here that, for recording of data with a much lower current, the value considered preferable for the low-resistance state is to be higher.

The upper electrode 30 may be made of a material similar to that of the lower electrode 10, i.e., a well-known material for use of semiconductor wiring, and preferably, be made of a stable material not reacting with the ion source layer 21 even after post-annealing.

With such a memory element 1 of the embodiment, when voltage or current pulses are applied by a power supply circuit (pulse application unit; not shown) via the lower and upper electrodes 10 and 30, the memory layer 20 shows a change of the electrical characteristics thereof, e.g., change of the resistance value thereof, thereby performing information writing, erasing, and reading. In the below, such an operation is described specifically.

First of all, a positive voltage is applied to the memory element 1 such that the upper electrode 30 is at a positive potential, and the lower electrode 10 side is at a negative potential, for example. In response thereto, any metallic element in the ion source layer 21 is ionized and diffused to the resistance change layer 22, and then is deposited by bonding with electrons on the lower electrode 10 side. As a result, a filament is formed on the interface between the lower electrode 10 and the memory layer 20. This filament is made of a low-resistance metallic element reduced in the form of metal.

Alternatively, the ionized metallic element remains in the resistance change layer 22, and forms an impurity level. As a result, a conductive path is formed in the resistance change layer 22, and this accordingly decreases the resistance value of the memory layer 20, i.e., the memory layer 20 shows a decrease of resistance value to be lower (to be in the low-resistance state) than that in the initial state (in the high-resistance state).

Thereafter, even if the memory element 1 becomes free of voltage by stopping the application of the positive voltage thereto, the state of low resistance is retained. This means information writing is done. For use in a once-writable memory device, i.e., a so-called PROM (Programmable Read Only Memory), the memory element 1 is completed with recording only by the process of recording described above. On the other hand, for application use in an erasable memory device, i.e., RAM (Random Access Memory), EEPROM (Electronically Erasable and Programmable Read Only Memory), or others, a process of erasing is necessary. During the process of erasing, a negative voltage is applied to the memory element 1 such that the upper electrode 30 is at a negative potential, and the lower electrode 10 side is at a positive potential, for example. In response thereto, in the filament formed inside of the memory layer 20, the metallic element is ionized, and then is dissolved into the ion source layer 21 or is bonded with Te or others, thereby forming a compound such as $Cu_2Te$ or $CuTe$. As a result, the filament made of the metallic element disappears or is decreased in area, and the resistance value thus shows an increase.

Thereafter, even if the memory element 1 becomes free of voltage by stopping the application of the negative voltage thereto, the resistance value therein remains high. This allows erasing of any information written thereto. By repeating such a procedure, the memory element 1 is to be subjected to repeated writing of information and erasing of the written information.

If the state high in resistance value is correlated with information of "0", and if the state low in resistance value is correlated with information of "1", for example, the information of "0" is to be changed to the information of "1" in the process of information recording by the application of a positive voltage, and the information of "1" is to be changed to the information of "0" in the process of information erasing by the application of a negative voltage. Note that, in this example, although the operation of decreasing the resistance of the memory element is correlated with the writing operation and the operation of increasing the resistance thereof is correlated with the erasing operation, the correlation may be inversed.

For demodulation of any recorded data, the larger ratio is more preferable between an initial resistance value and an after-recording resistance value. However, a too large resistance value of the resistance change layer 22 causes a difficulty in writing, i.e., in decreasing the resistance. As a result, since a threshold voltage for writing is increased too much, the initial resistance value is adjusted to be 1 G$\Omega$ or smaller. The resistance value of the resistance change layer 22 is possibly controlled by the thickness thereof or by the content of anions therein, for example.

In this embodiment, the resistance change layer 22 is made of a compound mainly containing Te. Therefore, during the decrease of resistance of the resistance change layer 22, the metallic element diffused from the ion source layer 21 is stabilized in the resistance change layer 22 so that the resulting low-resistance state becomes easy to retain. Moreover, compared with oxides high in electronegativity and silicon compounds being covalent compounds, the binding force of Te with the metallic element is weaker, and thus the metallic element diffused inside of the resistance change layer 22 is easily moved to the ion source layer 21 by the application of an erasing voltage so that the erasing characteristics are improved. Note that, as for the electronegativity of the chalcogenide compounds, since the absolute values thereof are in the ascending order of tellurium<selenium<sulfur<oxygen, the effect of improvement is to be high with the lower content of oxygen in the resistance change layer 22, and with the use of any chalcogenide compound low in electronegativity.

Moreover, in the embodiment, as described above, the ion source layer 21 preferably contains Ze, Al, Ge, and others. In the below, the reasons thereof are described.

When the ion source layer 21 contains Zr, this Zr acts as an ionizing element together with the metallic element such as copper (Cu) described above so that the resulting conductive path is a mixture of Zr and the above-described metallic element such as Cu. Herein, Zr seems to be reduced on the cathode electrode during the operation of writing, and seems to form a filament in the form of metal in the low-resistance state after the writing. The metal filament as a result of reduction of Zr is relatively difficult to dissolve in the ion source layer 21 containing the chalcogenide element(s) such as S, Se, and Te. Therefore, once the state is put in writing, i.e., in the low-resistance state, the resulting low-resistance state is retained more easily than in the case with a conductive path containing only the above-described metallic element such as Cu. For example, Cu is formed as a metal filament by the operation of writing. However, Cu in the form of metal is dissolved easily in the ion source layer 21 containing the chalcogenide element(s), and in the state of no application of voltage pulses for writing, i.e., in the state of data retention, Cu is ionized again and the state is changed to high resistance. The resulting characteristics of data retention are not thus satisfactory. On the other hand, combining Zr with any appropriate content of Cu facilitates amorphization, and keeps uniform the microstructure of the ion source layer 21, thereby contributing to the improvement of the characteristics of resistance value retention.

Also for retention of the high-resistance state during erasing, when the ion source layer 21 contains Zr, a conductive path to be formed contains Zr, for example, and when Zr is dissolved in the ion source layer 21 again as ions, due to the lower ion mobility of Zr at least than Cu, the Zr ions are resistant to move even if the temperature is increased, or even if they are left as they are for a long time. As such, Zr in the form of metal is not easily deposited on the cathode electrode, and thus remains high in resistance even if it is kept in the temperature higher than the room temperature or if it is left as it is for a long time.

Moreover, when the ion source layer 21 contains Al, if the upper electrode is biased to a negative potential as a result of the erasing operation, the high-resistance state (erasing state) is stabilized by forming an oxide film stable on the interface between the ion source layer 21 behaving like a solid-electrolyte layer and the anode electrode. This also contributes to the increase of the repetition frequency considering the self-reproduction of the resistance change layer. Herein, Al is surely not the only option, and Ge or others acting similar thereto may be also used.

As such, when the ion source layer 21 contains Zr, Al, Ge, and others, compared with the previous memory element, the resulting memory element has the improved characteristics of wide-range resistance value retention and of high-speed operation of writing and erasing, and the increased repetition frequency. Moreover, if any resistance state intermediate between high and low is created through adjustment of an erasing voltage during a change of resistance from low to high, for example, the resulting intermediate state is to be retained with a good stability. Accordingly, the resulting memory is capable not only of binary storage but also of multilevel storage. Herein, such an intermediate state is possibly created also through adjustment of the amount of atoms deposited by changing a write current during a change of resistance from high to low.

Such various characteristics important for the operation of memory, i.e., the characteristics of operation of writing and erasing with voltage application, the characteristics of resistance value retention, and the repetition frequency of operation, vary depending on the addition content of Zr, Cu, and Al, and also Ge.

If the content of Zr is too much, for example, the resulting ion source layer 21 is decreased too much in resistance value, thereby failing in voltage application effectively to the ion source layer 21, or resulting in a difficulty in dissolving Zr in the chalcogenide layer. This especially causes a difficulty in erasing, and the threshold voltage for erasing is increased based on the addition content of Zr. If the content of Zr is all too much, this results in a difficulty also in writing, i.e., in decreasing of resistance. On the other hand, if the addition content of Zr is too little, the effect of improving the characteristics of wide-range resistance value retention as described above is impaired. In consideration thereof, the content of Zr in the ion source layer 21 is preferably 7.5 or more, and more preferably, 26 atomic % or less.

Moreover, although adding an appropriate content of Cu to the ion source layer 21 indeed facilitates amorphization, if the content thereof is too much, Cu in the form of metal degrades the characteristics of writing retention or adversely affects the speed of the writing operation as is not stable enough in the ion source layer 21 containing the chalcogen element(s). Whereas a combination of Zr and Cu produces the effect of making amorphous the ion source layer 21 with ease, and of keeping uniform the microstructure of the ion source layer 21. This accordingly prevents the material components in the ion source layer 21 from becoming not uniform by the repeated operation, thereby increasing the repetition frequency and improving the retention characteristics. When the content of Zr in the ion source layer 21 is enough in the above-described range, the conductive path made of metal zirconium (Zr) is supposed to remain as it is even if the conductive path made of Cu is dissolved again into the ion source layer 21, and thus the characteristics of writing retention are not affected. Moreover, as for the preferable addition content of Cu, as long as cations and anions possibly being the results of dissociation and ionization are in the equivalent relationship of the amount of charge, the equivalence ratio of the charge of ions is supposed to fall within a range of {(Highest Valence of Zr Ions× Number of Moles or Atomic %)+(Valence of Cu Ions×Number of Moles or Atomic %)}/(Valence of Chalcogen Ions× Number of Moles or Atomic %)=0.5 to 1.5.

Note here that, virtually, the characteristics of the memory element 1 are dependent on the composition ratio between Zr and Te. Accordingly, the composition ratio between Zr and Te preferably falls within the following range.

Composition Ratio of Zr(Atomic %)/Composition Ratio of Te(Atomic %)=0.2 to 0.74

This is not evident at all times, but since Cu has the degree of dissociation lower than that of Zr, and since the resistance value of the ion source layer 21 is determined by the composition ratio between Zr and Te, as long as the composition ratio between Zr and Te falls within the above-described range, the resistance value remains suitable. This thus seems because the bias voltage applied to the memory element 1 works effectively to the portion of the resistance change layer 22.

When the value does not fall within the range described above, e.g., when the equivalence ratio is too large, the balance between the cations and anions is lost, and thus among the existing metallic elements, any element not ionizing is increased in amount. Therefore, the conductive path generated by the operation of writing during the operation of erasing may not be eliminated efficiently. Similarly, when the anion element exists too much because the equivalence ratio is too small, the conductive path in the form of metal generated by the operation of writing is not inclined to remain in the form of metal. The characteristics of writing state retention thus seem to be degraded.

When the content of Al is too much, the Al ions become easy to move, thereby creating the state of writing by reduction of the Al ions. Since Al is not stable enough in the form of metal in the chalcogenide solid electrolyte, the characteristics of low-resistance writing state retention are degraded. On the other hand, when the content of Al is too little, the effect of improving the erasing operation itself or the characteristics of high-resistance region retention is impaired, thereby decreasing the repetition frequency. In consideration thereof, the content of Al in the ion source layer 21 is preferably 30 atomic % or more, and more preferably, 50 atomic % or less.

Herein, Ge is not necessarily contained, but when Ge is to be added, the content thereof is preferably 15 atomic % or less considering that too much content of Ge degrades the characteristics of writing retention.

Moreover, in addition to Zr, using the transition metallic elements described above, especially Hf, Mo, W, Nb, Ta, Pt, Cr, Mn, and Fe, favorably leads to stabilization of the microstructure of the ion source layer 21, and to improvement of filament retention, i.e., to improvement of retention characteristics of the low-resistance resistance change layer 22.

In the below, the manufacturing method of the memory element 1 in the embodiment is described.

First of all, on a substrate formed with a CMOS circuit such as selection transistor, the lower electrode 10 made of TiN is formed, for example. Thereafter, if necessary, any oxides or others on the surface of the lower electrode 10 are removed by reverse sputtering, for example. Next, the formation of layers is performed up to the upper electrode 30 including the resistance change layer 22, and the ion source layer 21 in succession through exchange of targets in a device for sputtering. The targets herein are those each with the composition adapted for the material of the corresponding layer. The diameter of the electrode is 50 to 300 nm$\phi$. A film of alloy is formed at the same time using a target of a component element.

After the formation of layers up to the upper electrode 30, a wiring layer (not shown) is formed for connection to the upper electrode 30, and a contact section is connected to achieve a common potential among all of the memory elements 1. Thereafter, the layered film is subjected to a post-annealing process. As such, the memory element 1 of FIG. 1 is completed.

In this memory element 1, as described above, a voltage is so applied that the upper electrode 30 is at a positive potential and the lower electrode 10 is at a negative potential, thereby forming a conductive path on the interface between the lower electrode 10 and the resistance change layer 22. This accordingly decreases the resistance value of the resistance change layer 22 so that writing is performed. Next, to each of the upper and lower electrodes 30 and 10, applied this time is a voltage whose polarity is opposite to that applied thereto for writing. In response thereto, the metallic element in the conductive path formed inside of the resistance change layer 22 is ionized again, and then is dissolved into the ion source layer 21. This accordingly increases the resistance value of the resistance change layer 22 so that erasing is performed.

For increasing the capacity of the resistance change memory, i.e., for microfabricating the memory element 1, preventing the increase of the operation current value is important. To be specific, the operation current value is expected to be 100 μA or smaller considering the strength of transistors to be driven or diodes.

The current value at the time of changing the state of the resistance change memory to low resistance (to the state of writing) is possibly controlled by changing the drive current value of the transistor. Specifically, by reducing the drive current value of the transistor, the current value that puts the resistance change memory to the low-resistance state may be prevented from increasing. However, with a smaller operation current value, the conductive path (filament) to be formed during writing of data is decreased in width. The metal filament decreased in width as such becomes not stable unlike the metal filament to be formed during writing of data with a high current value.

Moreover, for preventing the current value from increasing when the resistance change memory is changed in state to high resistance (to the state of erasing), similarly to the case of writing of data, the transistor may be decreased in drive current value. Note here that if the transistor is low in drive voltage, this makes obvious the influence of reducing the heat generation in the resistance change memory, and of dividing the voltage to unnecessary portions of the transistor or of the resistance change memory, whereby the operation margin abruptly drops.

Figure 2:
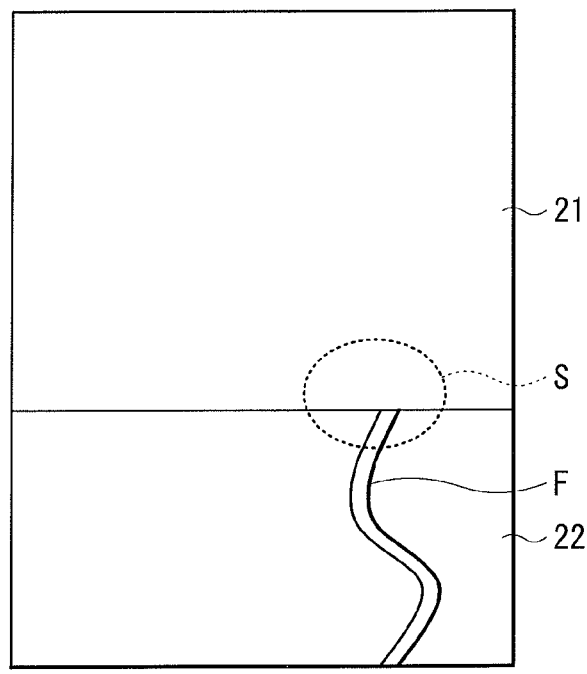
FIG. 2 is a schematic diagram for illustrating any resistance change of the memory element of FIG. 1.
Figure 9A:
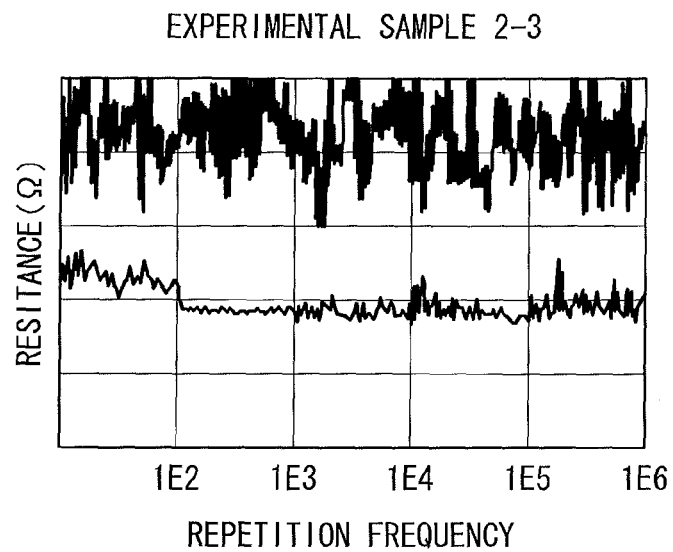
FIGS. 9A and 9B are each a diagram showing the repetition characteristics also of Example 2.
Figure 9B:
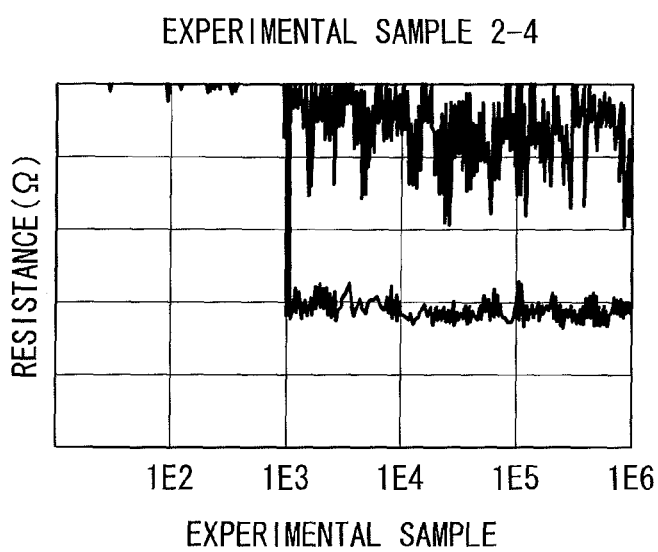

FIG. 2 is a schematic view of the memory layer 20 in the memory element 1 during writing of data. As described above, a filament F is formed in the memory layer 20. More in detail, as shown in FIG. 9, the filament F seems to be formed from the interface between the ion source layer 21 and the resistance change layer 22 toward the interface between the resistance change layer 22 and the lower electrode 10. With the voltage pulses applied on a nanosecond basis, the filament F formed in the resistance change layer 22 goes through the resistance change layer 22 by diffusion of metallic ions from the ion source layer but the filament is not stable in terms of diameter and density. As such, the filament F formed by the voltage applied on a nanosecond basis seems to show almost no difference of state no matter with what current value. Since the filament F is mainly made of alloy, the resistivity thereof is smaller than that of the ion source layer. Therefore, when the formation of the filament F is in progress, since the filament F itself becomes difficult to be under voltage application, the formation reaction seems to take place mainly in the vicinity of the interface between the filament F and the ion source layer.

On the other hand, during erasing of data, the filament F is to be dissolved with a good efficiency by the application of voltage to a reaction region S in the vicinity of the interface between the filament F and the ion source layer 21. The interface is where the formation reaction of the filament F is in progress. With the filament dissolved efficiently as such, the resistance value of the resistance change layer 22 is expected to be restored. However, if the filament F and the ion source layer 21 have a small difference of resistivity, the voltage is applied not only to the reaction region S but also to the filament F being stable, i.e., the voltage is dividedly applied. As a result, the erasing characteristics are degraded, and the repetition characteristics are degraded in the resulting resistance change memory. Furthermore, when the filament F is too high in resistance, a ratio of resistance value between the ion source layer 21 and the filament F becomes a significant factor. This is applicable also to a resistance change memory having the structure of two or more layers.

In the memory element 1 in this embodiment, the ion source layer 21 is set to have the resistivity higher than that of the filament to be formed, specifically 2.8 mΩcm or higher. The upper limit of the resistivity is of a value not causing too much application of voltage dividedly to the ion source layer 21, specifically lower than 1 Ωcm. This favorably leads to the efficient application of voltage to the interface between the ion source layer 21 and the resistance change layer 22, i.e., to the region where the formation reaction of the filament is taking place (the reaction region S), such that the filament is to be dissolved.

As described above, in the memory element 1 in this embodiment, since the ion source layer has the resistivity of 2.8 mΩcm or higher but lower than 1 Ωcm, in the filament formed between the ion source layer 21 and the lower electrode, i.e., in the filament formed inside of the resistance change layer 21, the voltage is applied efficiently to the interface between the ion source layer 21 and the resistance change layer 22 where the formation reaction is taking place. As a result, the filament is to be dissolved efficiently even with a low voltage, and the resistance value of the resistance change layer 22 is to be restored. In other words, the repetition characteristics are to be favorably improved.

Moreover, by using two or more of transition elements, especially zirconium (Zr), hafnium (Hf), Mo, W, niobium (Nb), Ta, platinum (Pt), Cr, manganese (Mn), and iron (Fe), the resulting ion source layer 21 becomes stable. As a result, the metal filament to be formed during writing of data is prevented from diffusing to the ion source layer 21, thereby improving the characteristics of data retention. In combination of the transition metals described above, the ion source layer 21 becomes easily adjustable in resistivity.

(Memory Device)

By arranging a plurality of memory elements 1 described above in rows or in a matrix, for example, a memory device (memory) is possibly configured. At this time, as appropriate, the memory elements 1 may be each connected with a MOS transistor for element selection use or with a diode to configure a memory cell. The resulting memory cells may be then each connected to a sense amplifier, an address decoder, circuits of writing, erasing, and reading, and others by wiring.

Figure 3:
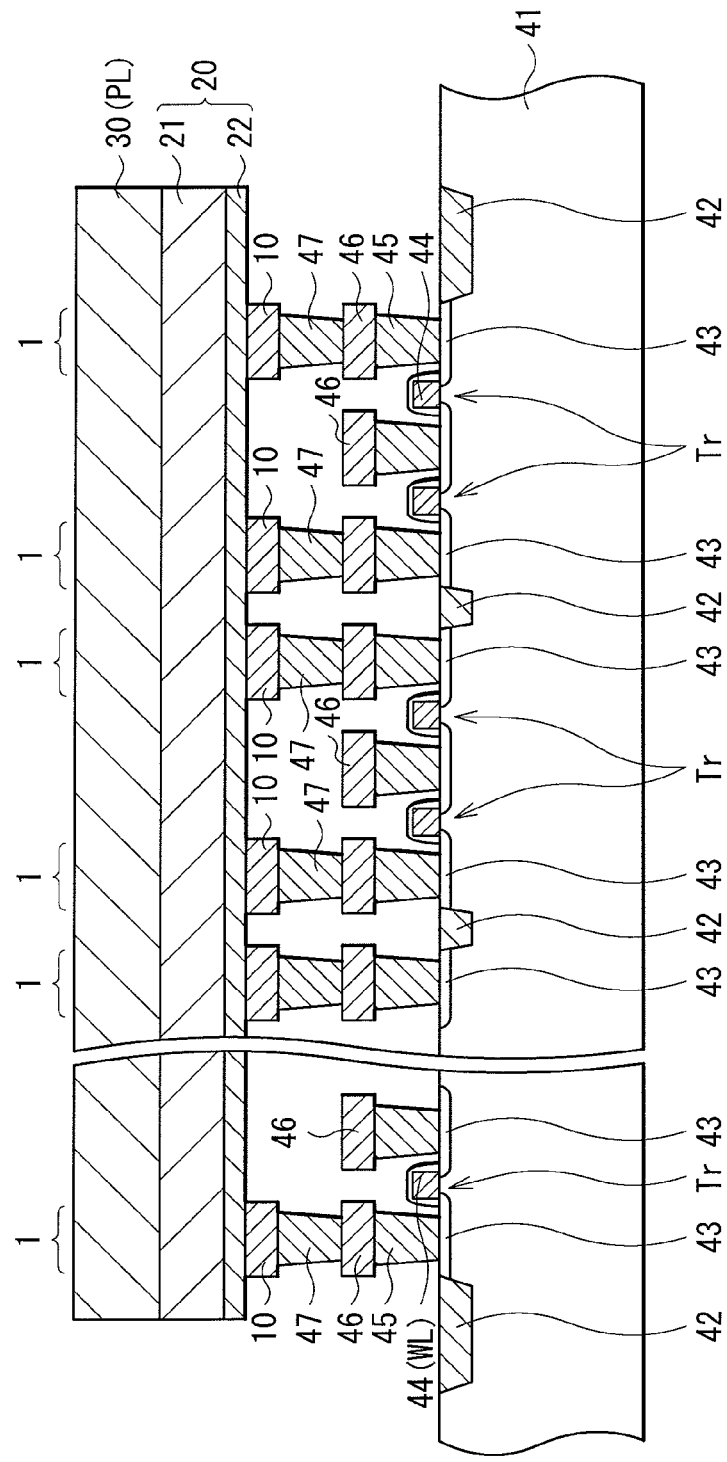
FIG. 3 is a cross-sectional view of a memory cell array using the memory element of FIG. 1, showing the configuration thereof.
Figure 4:
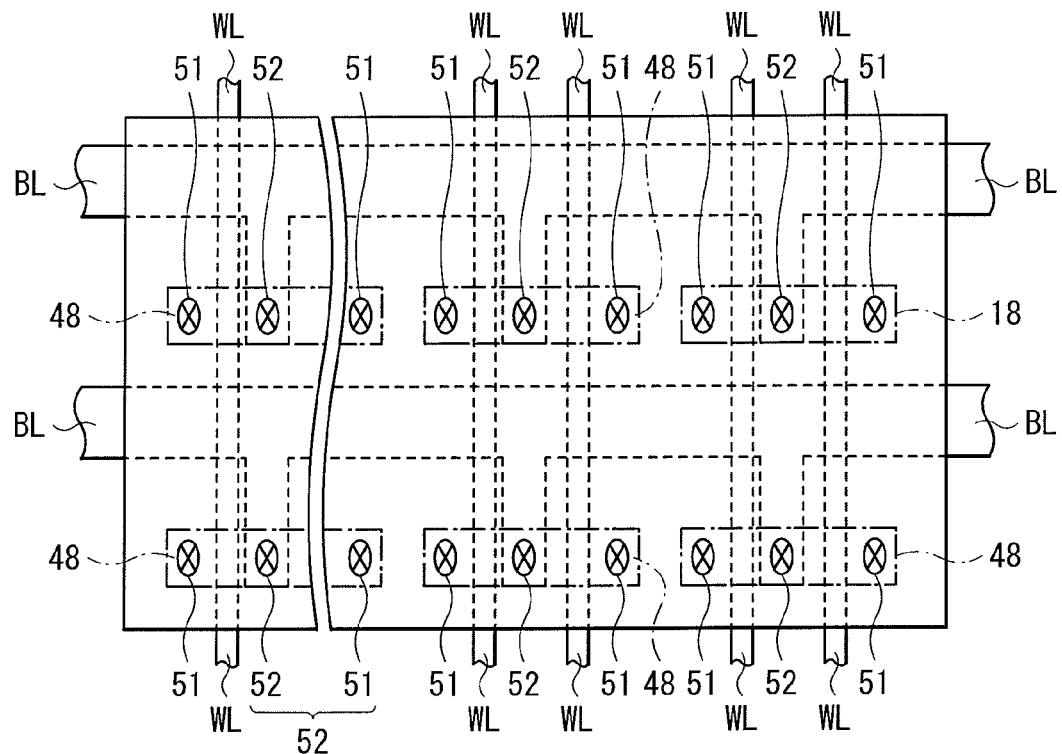
FIG. 4 is a plan view of the memory cell array of FIG. 3.

FIGS. 3 and 4 each show an exemplary memory device (memory cell array) including a large number of memory elements 1 arranged in a matrix. FIG. 3 shows the cross-sectional configuration of the memory cell array, and FIG. 4 shows the configuration thereof in a planar view. In this memory cell array, to each of the memory elements 1, wiring for connection to the lower electrode 10 side thereof is so provided as to intersect wiring connected to the upper electrode 30 side thereof, and at the respective intersection points, the memory element 1 is disposed.

The memory elements 1 all share the layers, i.e., the resistance change layer 22, the ion source layer 21, and the upper electrode 30. In other words, these layers, i.e., the resistance change layer 22, the ion source layer 21, and the upper electrode 30, are each for the shared use by all of the memory elements 1 (are each one specific layer for use by all of the memory elements 1). The upper electrode 30 is a plate electrode PL for shared use by any adjacent cells.

On the other hand, the lower electrode 10 is provided individually to each of the memory cells so that the memory cells are electrically separated from one another. As such, the memory elements 1 in the memory cells are each defined by position corresponding to its lower electrode 10. The lower electrodes 10 are each connected to its corresponding MOS transistor Tr for cell selection use, and the memory elements 1 are each disposed above its corresponding MOS transistor Tr.

The MOS transistor Tr is configured by source/drain regions 43, and a gate electrode 44, which are formed in a region separated by an element separation layer 42 in the substrate 41. A sidewall insulation layer is formed on the wall surface of the gate electrode 44. The gate electrode 44 serves also as a word line WL, which is one of two pieces of address wiring for the memory element 1. One of the source/drain regions 43 of the MOS transistor Tr is electrically connected to the lower electrode 10 of the memory element 1 via various layers, i.e., a plug layer 45, a metal wiring layer 46, and a plug layer 47. The other of the source/drain regions 43 of the MOS transistor Tr is connected to the metal wiring layer 46 via the plug layer 45. The metal wiring layer 46 is connected to a bit line BL (refer to FIG. 3), which is the remaining piece of address wiring for the memory element 1. Note that, in FIG. 4, an active region 48 of the MOS transistor Tr is indicated by alternate long and short dashed lines. In the active region 48, contact sections 51 are connected to the lower electrode 10 of the memory element 1, and a contact section 52 is connected to the bit line BL.

In such a memory cell array, when a voltage is applied to the bit lines BL with the gate of the MOS transistor Tr turned ON by the word line WL, the voltage is directed to the lower electrode 10 of the selected memory cell via the source/drain of the MOS transistor Tr. In this example, as for the voltage applied to the lower electrode 10, when the polarity thereof is at a negative potential compared with the potential of the upper electrode 30 (the plate electrode PL), the resistance value of the memory element 1 is changed in state to low resistance as described above, whereby the selected memory cell is written with information. Next, when the potential of the voltage applied this time to the lower electrode 10 is positive compared with the potential of the upper electrode 30 (the plate electrode PL), the resistance value of the memory element 1 is changed in state again to high resistance, whereby the information written to the selected memory cell is erased. For reading of the written information, for example, a selection of memory cell is made by the MOS transistor Tr, and with respect to the selected memory cell, a predetermined level of voltage or current is applied. The current or voltage varying in level based on the resistance state of the memory element 1 at this time is detected via a sense amplifier or others connected to the tip of the bit line BL or of the plate electrode PL. Herein, the voltage or current for application to the selected memory cell is set to be smaller than the threshold value of the voltage or others at which the memory element 1 shows a change of resistance value.

The memory device of this embodiment is applicable to various types of memory devices as described above. For example, the memory device is applicable for use with any types of memories such as once-writable PROM, electrically erasable EEPROM, or so-called RAM available for high-speed writing, erasing, and reproduction.

Second Embodiment

Figure 5:
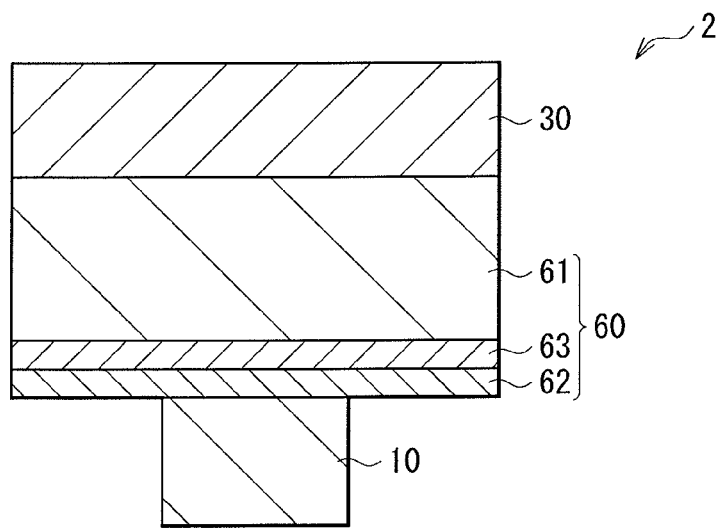
FIG. 5 is a cross-sectional view of a memory element in a second embodiment of the present disclosure, showing the configuration thereof.
Figure 7A:
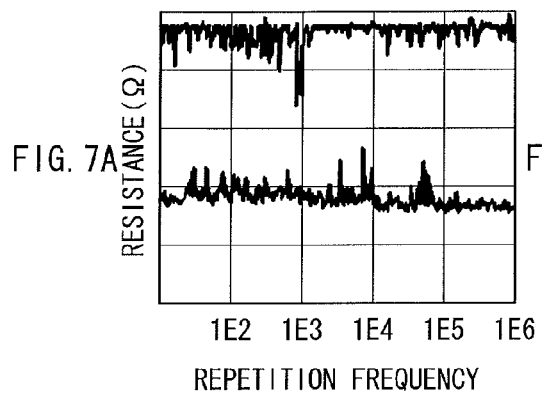
FIG. 7A to 7E are each a diagram showing the repetition characteristics also of Example 1.
Figure 7B:
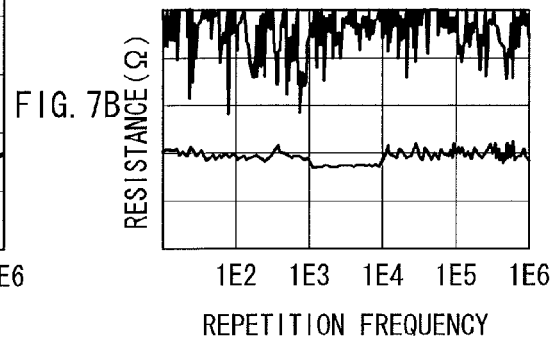
Figure 7C:
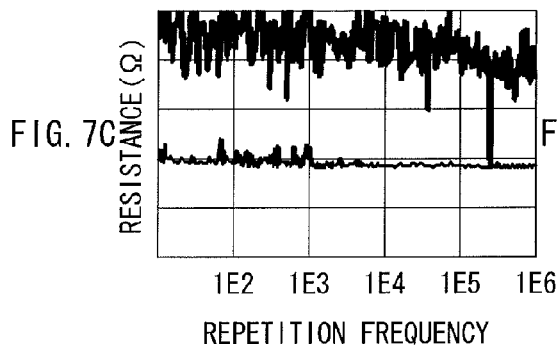
Figure 7D:
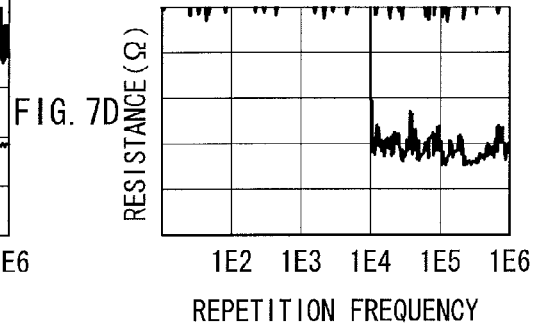
Figure 7E:
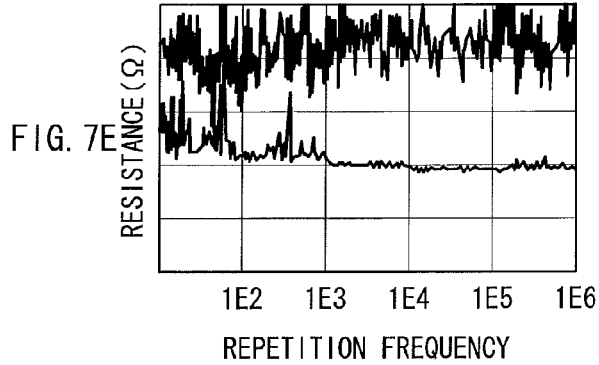

FIG. 5 is a cross-sectional view of a memory element 2 in a second embodiment of the present disclosure, showing the configuration thereof. Any configuration component similar to that of the first embodiment described above is provided with the same reference numeral, and is not described again.

The memory element 2 includes the lower electrode 10 (first electrode), a memory layer 60, and the upper electrode 30 (second electrode) in this order. The memory layer 60 is in the structure different from that in the first embodiment, i.e., is in the three-layer structure including an ion source layer 61, an intermediate layer 63, and a resistance change layer 62 in this order from the upper electrode 30 side.

The ion source layer 61 is in the structure similar to that of the ion source layer 21 described above, i.e., includes at least one of transition metals in a group of titanium (Ti), zirconium (Zr), hafnium (Hf), vanadium (V), niobium (Nb), tantalum (Ta), chromium (Cr), molybdenum (Mo), and tungsten (W) together with aluminum (Al) ion, and a chalcogen element. The resistance change layer 62 is in the structure similar to that of the resistance change layer 22 described above, i.e., includes an oxide or nitride containing at least one of rare-earth elements including Gd (gadolinium), Al, Mg (magnesium), Ta, Si (silicon), and Cu.

The intermediate layer 63 is configured similarly to the resistance change layer 22 in the first embodiment described above, i.e., is configured by an insulator or semiconductor to be stable even if it is in contact with the ion source layer 61, and has the resistivity lower than that of the resistance change layer 62. The intermediate layer 63 is made of aluminum (Al), and a compound mainly containing Te that behaves as an anionic component. Such a compound is exemplified by AlTe, MgTe, or ZnTe. As for the composition of the compound containing Te as such, e.g., AlTe, the content of Al is preferably 20 atomic % or higher but 60 atomic % or lower. As an anionic component, a chalcogen element such as sulfur (S) or selenium (Se) may be included together with Te. Note that the intermediate layer 63 made of AlTe has the band gap of 2.5 eV, and the resistance change layer 62 made of AlOx has the band gap of 8 eV to 9 eV, for example. The intermediate layer 63 in this embodiment is the one serving as an insulation film, and may be regarded as a piece of resistance change layer in combination with the resistance change layer 62.

The ratio of the content of aluminum (concentration of aluminum) to the content of a chalcogen element in the intermediate layer 63 is preferably smaller than that in an ion supply layer 21B, i.e., the ratio of the content of aluminum (concentration of aluminum) to the content of a chalcogen element. As for aluminum (Al) in the intermediate layer 63, it is supposed to be produced by diffusion as a result of the concentration gradient from the ion source layer 61, and thus is expected to be smaller in content than the stoichiometric composition of $Al_2Te_3$. Such aluminum (Al) in the intermediate layer 63 is supposed to exist mostly in the form of ions. As such, the effective use of the applied electric potential for driving of the ions favorably leads to the nonvolatile memory operation at a lower current with the better retention characteristics described above.

The effect and advantage of the memory element 2 in the second embodiment are similar to those achieved with the memory element 1 in the first embodiment, but with the intermediate layer 63 provided as above, the resulting memory is possibly with improved retention characteristics together with the repetition endurance remained satisfactory. What is more, the operation is stably performed with a low current.

EXAMPLES

In the below, specific examples of the present disclosure are described.

Example 1

The memory elements 1 and 2 of FIGS. 1 and 5 were respectively manufactured similarly to the memory elements in the embodiments described above. First of all, the lower electrode 10 made of TiN with a transistor incorporated in the base was subjected to cleaning and plasma oxidation by argon plasma. The memory layers 20 and 40 and the upper electrode 30 were then formed on the resulting lower electrode 10 using a device for sputtering. The electrode diameter was 150 nmφ. The layer made of alloy was formed at the same time using a target of the component element. Thereafter, the surface of the upper electrode 30 was subjected to etching, thereby forming a wiring layer (Al layer) with the thickness of 200 nm for a connection to the contact portion where an external circuit was connected for provision of an intermediate potential (Vdd/2). Thereafter, in a furnace for a vacuum heat treatment, the resulting structure was subjected to the heat treatment for two hours at the temperature of 320° C. as post annealing treatment. In this manner, the memory cell arrays shown in FIGS. 3 and 4 were manufactured with various compositions and film thicknesses, and the results were used as Experimental Samples 1-1 to 1-9. In these Experimental Samples 1-1 to 1-9, the upper wiring pattern connected to the upper electrode 30 was grounded at the intermediate potential of Vdd/2, and then a voltage was applied to the gate electrode of any selected memory cell, i.e., to the word line WL, so that the state was changed to ON. Thereafter, the "operation of writing" was performed to the 20 elements in total arranged in 10 elements×2 rows in the memory cell array, and then reading of the resistance value was performed. The "operation of writing" was an operation of applying a voltage for writing of 3.0 V with any pulse width and writing at 10 ns/erasing at 10 ns to, in the source/drain 13 of the transistor Tr, the electrode connected to the one of those not connected to the memory elements 1 and 2, i.e., to the bit line BL. Next, a voltage (3 to 3.5 V during writing and 1.6 to 2 V during erasing) was applied to the gate electrode to change the state to ON, and a voltage reverse to that applied during the "writing" was applied to the upper and lower electrodes to perform the "operation of erasing", thereby reading the resistance value in the state of erasing. By repeatedly performing such operations of writing and erasing to the memory cell arrays, the assessment was done to the characteristics of such a repeated operation. The results are shown in FIGS. 6 and 7. The memory cell arrays in Examples each have the 1-transistor-1-resistor (1T1R) configuration, and the size of the transistor was W/L=0.36/2.0 μm. Moreover, even if the resistor was short-circuited when a gate voltage of 3.5 V was applied, the maximum flow was about 75 μm. However, only the transistor used in Experimental Sample 1-1 was possibly driven by a high current. Moreover, TiN was subjected to plasma oxidation not to cause a reaction between the electrode materials, i.e., Ti and Te, but TiN was surely not the only option for use, and as long as the electrode material for use was any of those described above, the characteristics remained the same.

In each of Experimental Samples 1-1 to 1-9, the composition of "lower electrode/resistance change layer/intermediate layer/ion source layer/upper electrode", the film thickness thereof, and the resistance value of the ion source layer 21 (42) are as below. Note that the values for the intermediate layer are ratios. The resistivity of the ion source layer 21 (41) is the one measured based on the sheet resistance. Note that in Experimental Sample 1-3, no intermediate layer was provided. Only in Experimental Sample 1-3, the lower electrode was provided thereon with Al for plasma oxidation, but there was no specific difference from any other Experimental Samples, i.e., Experimental Samples 1-1, 1-2, and 1-4 to 1-9.

Experimental Sample 1-1

TiN/Plasma Oxidation/Al1Te9 (3.5 nm)/Te28Al37Zr15Cu15Ge5 atomic % (45 nm)/W; 1.32 mΩcm Experimental Sample 1-2

TiN Electrode/Plasma Oxidation/Al1Te9 (3.5 nm)/Te34Al27Zr16.5Cu16.5Ge6 atomic % (45 nm)/W; 2.04 mΩcm Experimental Sample 1-3

TiN Electrode/Plasma Oxidation/Al1Te9 (3.5 nm)/Te31Al37Zr13Cu13Ge6 atomic % (45 nm)/W (50 nm); 2.88 mΩcm Experimental Sample 1-4

TiN Electrode/Al (1 nm) Plasma Oxidation/Te31Al37Zr13Cu13Ge6 atomic % (45 nm)/W (50 nm); 2.88 mΩcm Experimental Sample 1-5

TiN Electrode/Plasma Oxidation/Al1Te9 (3.5 nm)/Te35Al37Zr11Cu11Ge6 atomic % (45 nm)/W; 6.43 mΩcm Experimental Sample 1-6

TiN Electrode/Plasma Oxidation/Al1Te9 (3.5 nm)/Te40.5Al27Zr12.5Cu12.5Ge7.5 atomic % (45 nm)/W; 15.72 mΩcm Experimental Sample 1-7

TiN Electrode/Plasma Oxidation/Te (5 nm)/Cu13Mo13Te33Al41 atomic % (45 nm)/Zr (50 nm); 15.5 mΩcm Experimental Sample 1-8

TiN Electrode/Plasma Oxidation/Al1Te9 (3.5 nm)/Te45.6Al32.6Zr10.9Cu10.9 atomic % (45 nm)/W; 44.6 mΩcm Experimental Sample 1-9

TiN Electrode/Plasma Oxidation/Te (5 nm)/Cu13Mn13Te33Al41 atomic % (45 nm)/Zr (50 nm); 127 mΩcm In Experimental Sample 1-1, first of all, the repeated operation was measured with a write current of 50 μA, and an erasing current of 250 μA (high current). FIG. 6A-1 shows the result thereof. As is known from the drawing, the repetition characteristics remained sufficient up to the repetition of $10^6$. On the other hand, when the repeated operation was measured with the erasing current of 75 μmA (low current), repetition became difficult or impossible after repetition of about $10^3$ in both Experimental Sample 1-1 (FIG. 6A-2) and Experimental Sample 1-2 (FIG. 6B).

In Experimental Samples 1-3 to 1-8, even with the erasing current of 75 μmA, the resulting repetition characteristics were of a sufficient level. Note here that, in Experimental Samples 1-6 to 1-8, the resistivity was set higher than those in Experimental Samples 1-3 to 1-5. Therefore, the resistivity might not take the optimum value due to the application of voltage dividedly to the ion source layer 61, but there was no problem in operation. This seems to be because movable ions in the ion source layer 61 were gathered in the vicinity of the interface between the metal filament and the ion source layer 61, thereby automatically changing the resistivity to be appropriate. In Experimental Sample 1-9 with the ion source layer having the resistivity of 127 mΩcm, writing became difficult after repetition of about $10^4$ at the voltage of 3.5 V. However, this may be solved by reducing the thickness of the resistance change layer because the ion source layer 21 is preferably thicker than the resistance change layer 22. Herein, the maximum possible film thickness for the ion source layer is about 5 nm not to cause a supply shortage of Cu ions during writing. As such, the preferable resistance value for the ion source layer 21 seems, at the maximum, lower than 1 Ωcm. In consideration thereof, for making the resistance change memory operate normally at a low current, the minimum possible value of the resistivity for the ion source layer 21 (61) may be an important factor. Herein, in comparison with Experimental Sample 1-3 (FIG. 6C), since Experimental Sample 1-4 (FIG. 7A) was with the better repetition characteristics, it is known that the provision of the intermediate layer 63 indeed improves the repetition characteristics.

Example 2

Using a method similar to that in Example 1 described above, Experimental Samples 2-1 to 2-4 were manufactured for assessment of the characteristics of writing retention. Experimental Samples 1-3 and 1-4 above were also assessed similarly. FIG. 8 shows the results thereof. Experimental Samples 2-3 and 2-4 were also assessed in terms of the repetition characteristics. FIG. 9 shows the results thereof. Note that, in the characteristics diagram of FIG. 8, the vertical axis indicates the resistance value of the resistance change layer 22 immediately after the writing with a transistor current of 1 to 200 μA, and with the voltage pulse duration of 1 ns to 10 ms. The lateral axis indicates, also after the writing, the resistance value of the resistance change layer 22 after the storage for an hour in an oven heated at 130° C., and then after a high-speed accelerated storage test.

In each of Experimental Samples 2-1 to 2-4, the composition of "lower electrode/resistance change layer/intermediate layer/ion source layer/upper electrode", the film thickness thereof, and the resistance value of the ion source layer 21 (61) are as below. Note that the values for the resistance change layer are ratios. The resistivity of the ion source layer 21 (61) is the one measured based on the sheet resistance.

Experimental Sample 2-1

TiN Electrode/Plasma Oxidation/Al1Te9 (3.5 nm)/Te31Al37Zr13Cu13Ge6 atomic %+W 5% (45 nm)/W (50 nm)

Experimental Sample 2-2

TiN Electrode/Plasma Oxidation/Al1Te9 (3.5 nm)/Te31Al37Zr13Cu13Ge6 atomic %+Ta 5% (45 nm)/W (50 nm)

Experimental Sample 2-3

TiN Electrode/Plasma Oxidation/Te (5 nm)/Cu13Zr7Mo6Te33Al41 atomic % (45 nm)/Zr (50 n); 6 mΩcm Experimental Sample 2-4

TiN Electrode/Plasma Oxidation/Te (5 nm)/Cu13Zr7Mo6Te33Al41 atomic % (23 nm)/Zr (50 nm); 6 mΩcm In Experimental Samples 2-1 to 2-4 in which the ion source layer 21 (61) was added with two or more high-melting-point transition metals, the characteristics of writing retention were better than those in Experimental Samples 1-3 and 1-4. This seems to be because the ion source layer 21 (61) was compensated in structure due to the addition of a plurality of transition metals so that the resulting structure became more firm. Further, since every transition metallic element has its own resistivity, by combining together a plurality of transition metallic elements, the resulting ion source layer 21 (61) became easy to be adjusted in resistivity. Still further, as in Experimental Sample 2-4, even if the ion source layer 21 was reduced in thickness, the characteristics of data retention characteristics and the repetition characteristics both remained the same.

Example 3

In Example 3, as for the metallic elements included in the ion source layer 21, Hf was used as an alternative to Zr used in Examples 1 and 2 for assessment of the repetition characteristics and the characteristics of writing retention. FIG. 10 shows the results thereof. Note that the test for the characteristics as such was performed under the conditions similarly to Examples 1 and 2.

In each of Experimental Samples 3-1 to 3-4, the composition of "lower electrode/resistance change layer/intermediate layer/ion source layer/upper electrode", the film thickness thereof, and the resistance value of the ion source layer 21 (61) are as below. Note that the values for the intermediate layer are ratios. The resistivity of the ion source layer 21 (41) is the one measured based on the sheet resistance.

Experimental Example 3-1

TiN Electrode/Plasma Oxidation/Te (5 nm)/Cu13Hf13Te33Al41 atomic % (45 nm)/Hf (50 nm); 0.73 mΩcm Experimental Example 3-2

TiN Electrode/Plasma Oxidation/Te (5 nm)/Cu13Hf7W6Te33Al41 atomic % (45 nm)/Hf (50 nm)

Experimental Example 3-3

TiN Electrode/Plasma Oxidation/Te (5 nm)/Cu14Hf7.5Mo2.5Te35Al41 atomic % (45 nm)/Hf (50 nm); 8.5 mΩcm Experimental Example 3-4

TiN Electrode/Plasma Oxidation/Te (5 nm)/Cu14Hf7.5Mo2.5Te35Al41 atomic % (20 nm)/Hf (50 nm); 8.5 mΩcm FIG. 10 shows that the repetition characteristics and the characteristics of data retention remained satisfactory even if the metallic element for use in the ion source layer 21 was changed from Zr to Hf. Moreover, by adding a plurality of transition metallic elements to the ion source layer 21 as in Experimental Samples 3-2 and 3-3, the characteristics of data retention and the repetition characteristics were more satisfactory than those in Experimental Sample 3-1. Moreover, even if the ion source layer 21 was reduced in thickness as in Experimental Sample 3-4, the resulting characteristics were of a sufficient level. In consideration thereof, as for the issue described in the first embodiment above, even the composition of the ion source layer 21 not containing Zr seems applicable.

While the present disclosure has been described in detail by referring to the first and second embodiments and Examples, the present disclosure is not restrictive to the embodiments and Examples described above, and it is understood that numerous other modifications may be possibly devised.

For example, in the embodiments and Examples described above, the configurations of the memory elements 1 and 2, and that of the memory cell array are specifically described. However, all of the layers are not necessarily provided, or any other layers may be also provided.

Moreover, for example, the materials of the layers, the film-forming methods and conditions, and others described in the embodiments and Examples above are surely not restrictive, and any other materials, or any other film-forming methods will also do. For example, the ion source layers 21 and 61 may be each added with any other types of transition metallic element such as Ti, Hf, V, Nb, Ta, Cr, Mo, or W as long as the composition ratio described above remains the same, and other than Cu, Ag, and Zn, nickel (Ni) may be added.

The present disclosure contains subject matter related to that disclosed in Japanese Priority Patent Application JP 2011-42174 filed in the Japan Patent Office on Feb. 28, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A memory element, comprising:
a first electrode, a memory layer, and a second electrode in this order, wherein
the memory layer includes
a resistance change layer disposed on the first electrode side, and
an ion source layer disposed on the second electrode side, and having a resistivity of 2.8 mΩcm or higher but lower than 1 Ωcm.

2. The memory element according to claim 1, wherein the memory layer includes an intermediate layer between the resistance change layer and the ion source layer.

3. The memory element according to claim 2, wherein the intermediate layer has a resistivity lower than that of the resistance change layer.

4. The memory element according to claim 1, wherein the ion source layer contains at least one metallic element of copper (Cu), aluminum (Al), germanium (Ge), and zinc (Zn), and at least one of oxygen (O), tellurium (Te), sulfur (S), and selenium (Se).

5. The memory element according to claim 4, wherein the ion source layer contains copper (Cu) and aluminum (Al) as the metal element, and tellurium (Te).

6. The memory element according to claim 5, wherein the ion source layer contains at least two of transition metals.

7. The memory element according to claim 6, wherein the transition metals include zirconium (Zr), hafnium (Hf), molybdenum (Mo), niobium (Nb), tantalum (Ta), titanium (Ti), platinum (Pt), chromium (Cr), manganese (Mn), and iron (Fe).

8. The memory element according to claim 4, wherein a change of resistance value occurs by formation of a low-resistance section including the metallic element in the resistance change layer in response to application of a voltage to the first and second electrodes.

9. A memory element, comprising:
a first electrode, a memory layer, and a second electrode in this order, wherein
the memory layer includes
a resistance change layer disposed on the first electrode side,
an ion source layer disposed on the second electrode side, and having a resistivity of 2.8 mΩcm or higher but lower than 1 Ωcm; and
an intermediate layer between the resistance change layer and the ion source layer, the intermediate layer including tellurium (Te).

10. The memory element according to claim 9, wherein the intermediate layer also contains aluminum (Al).

11. A memory device, comprising:
a plurality of memory elements each including a first electrode, a memory layer, and a second electrode in this order; and
a pulse application unit applying a voltage or current pulse selectively to the memory elements,
wherein,
the memory layer includes (a) a resistance change layer disposed on the first electrode side, and (b) an ion source layer provided on the second electrode side, and having a resistivity of 2.8 mΩcm or higher but lower than 1 Ωcm.

* * * * *